(12) United States Patent
Annavajjhala

(10) Patent No.: US 6,917,554 B2
(45) Date of Patent: Jul. 12, 2005

(54) PROTECTION CIRCUIT

(75) Inventor: Ravi P. Annavajjhala, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 10/626,469

(22) Filed: Jul. 24, 2003

(65) Prior Publication Data

US 2004/0223375 A1 Nov. 11, 2004

Related U.S. Application Data

(63) Continuation of application No. 10/038,105, filed on Jan. 2, 2002.

(51) Int. Cl.[7] .............................. G11C 7/00; H02H 3/22
(52) U.S. Cl. ........................ 365/226; 327/534; 361/111
(58) Field of Search ................................ 365/226, 227; 327/534, 537; 361/111, 56

(56) References Cited

U.S. PATENT DOCUMENTS

| | | |
|---|---|---|
| 4,282,555 A | 8/1981 | Svedberg |
| 4,311,930 A | 1/1982 | Chan et al. |
| 4,544,854 A | 10/1985 | Ulmer et al. |
| 4,595,847 A | 6/1986 | Weir |
| 5,301,150 A | 4/1994 | Sullivan et al. |
| 5,352,936 A | 10/1994 | Allen |
| 5,414,669 A | 5/1995 | Tedrow et al. |
| 5,426,391 A | 6/1995 | Tedrow et al. |
| 5,430,402 A | 7/1995 | Tedrow et al. |
| 5,442,586 A | 8/1995 | Javanifard et al. |
| 5,446,408 A | 8/1995 | Tedrow et al. |
| 5,455,794 A | 10/1995 | Javanifard et al. |
| 5,517,138 A | 5/1996 | Baltar et al. |
| 5,553,030 A | 9/1996 | Tedrow et al. |
| 5,602,794 A | 2/1997 | Javanifard et al. |
| 5,732,039 A | 3/1998 | Javanifard et al. |
| 5,767,735 A | 6/1998 | Javanifard et al. |
| 5,781,473 A | 7/1998 | Javanifard et al. |
| 5,852,540 A | 12/1998 | Haider |
| 5,869,873 A | 2/1999 | Yu |
| 5,937,063 A | 8/1999 | Davis |
| 5,946,258 A | 8/1999 | Everett al. |
| 6,055,143 A | 4/2000 | Yu |
| 6,362,942 B2 | 3/2002 | Drapkin et al. |
| 6,628,159 B2 * | 9/2003 | Voldman ..................... 327/534 |
| 6,680,512 B2 | 1/2004 | Nishikawa et al. |

OTHER PUBLICATIONS

Schematic "HVP21LC.1," (Jan. 24, 1997), corresponding to a circuit believed to have been incorporated in a product publicly distributed prior to Jan. 2, 2002 (1 page).

* cited by examiner

*Primary Examiner*—Son T. Dinh
(74) *Attorney, Agent, or Firm*—Fish & Richardson P.C.

(57) ABSTRACT

A protection circuit that permits the use of thin oxide transistor devices. In one embodiment, the circuit is used to protect internal nodes of a flash EEPROM chip from a power pad voltage. A thin oxide device can be used to directly couple the power pad to an internal node of the flash chip. Optionally, thin oxide devices can also be used to set the steady state internal node voltage and a current source can be coupled to the node to bleed sub-threshold current. In yet another embodiment, a pull down circuit is coupled to the node to pull the node immediately down to a desired steady state voltage when the EEPROM algorithm is completed.

55 Claims, 4 Drawing Sheets

PROTECTION CIRCUIT

CROSS-REFERENCE TO RELATED APPLICATION

This application is a continuation application of U.S. patent application Ser. No. 10/038,105, filed Jan. 2, 2002 by Ravi P. Annavajjhala, entitled "Protection Circuit," which is incorporated herein by reference in its entirety.

TECHNICAL FIELD

This invention relates to computer systems and, more particularly, to methods and apparatus for providing high voltages in circuitry manufactured by processes typically used to provide low voltage tolerant integrated circuitry.

BACKGROUND

Flash EEPROM memory arrays have been used in personal computers as a type of long term memory. For example, a flash EEPROM memory array may be used in place of a hard disk drive as described in U.S. Pat. No. 5,822,781, entitled "Sector Based Storage Device Emulator Having Variable-Sized Sector", issued to S. Wells on Oct. 13, 1998, and assigned to the assignee of the present invention. Such a flash memory array provides a smaller, lighter, functional equivalent of a hard disk drive and is not as sensitive to physical damage. Such a flash memory array would be especially useful in portable computers, where space and weight are important considerations. However, these flash EEPROM memory arrays may also require much higher voltages and substantially more power than that directly available from the batteries of low power portable computers.

Typically, a flash memory array is subdivided into blocks and the erase mode may erase one or more blocks of memory cells. The flash memory cell may be erased by removing excess charge from the floating gate. The conventional method of erasing all the cells in a block of flash memory requires the application of 12 volts to the source terminals of all of the memory cells in the block while the drain terminals are left floating and the gate terminals are grounded. Flash memory cells may be programmed by placing excess charge on the floating gate to increase the threshold voltage of the flash memory cell. Programming is typically achieved by applying approximately 11–12 volts to the gate, 6–7 volts to the drain, and grounding the source terminal so that electrons are placed on the floating gate by hot electron injection. Flash memory cells can be read by applying a fixed voltage to the gate of the flash memory cell in order to determine whether the flash memory cell is in an erased or a programmed state. This technique senses the drain-to-source current, $I_{ds}$, for the flash memory cell. Reading a flash memory cell typically requires the application of 5 volts to the gate, 1 volt to the drain, and grounding the source terminal. Thus, typical voltages required for flash memory applications include 5 volts for the read mode and 6 and 12 volts for both the program and erase modes.

Power for the flash memory device can be provided by a Vcc line and a Vpp line. The Vcc line is the primary power source for the flash device. The supplemental voltage provided by supply line, Vpp, is typically needed only when writing or erasing the memory because of the higher voltages needed during those operations. Vcc can be approximately 5 volts. Vpp, however, might be 3.3, 5, or 12 volts.

When Vpp is large, a correspondingly large voltage stress is encountered by the field effect transistor devices that pass Vpp to the internal nodes of the Flash chip. The high voltage stresses in turn cause premature breakdown of the transistors. Accordingly, transistors capable of tolerating high voltage stresses are suitable for such applications. Field effect transistor devices with thick oxide layers are relatively tolerant to sustained voltage gradients across their gate oxide on the order of 12 volts. However, since such thick oxide devices have a low transconductance (low GM), they have to be made very large to minimize the voltage drop across them. Such transistors can occupy an undue amount of chip surface area and disadvantageously increase chip size and production cost.

Thin oxide transistor devices such as S devices and P devices occupy much less space on the chip, but generally are not capable of withstanding the voltage stress caused by direct coupling to a sustained power pad voltage. Over time, the large voltage gradient can cause the oxide layers of such S and P devices to fail. For this reason, thick oxide transistor devices have typically been used in protection circuit applications.

DESCRIPTION OF DRAWINGS

Like reference symbols in the various drawings indicate like elements.

DETAILED DESCRIPTION

The invention relates to circuits for protecting low voltage tolerant devices from sustained high voltages with thin-oxide transistor devices. Depicted in FIGS. 1 through 4 is an exemplary system for protecting the internal nodes of a flash EEPROM device from high power pad voltages, such as 12 volt power pad voltages. The protection circuit component interposes parallel connected thin oxide transistor devices between the power pad and the internal nodes of the flash EEPROM device. The internal node voltage can be set at an acceptably low non-zero voltage by the threshold voltage drop across the transistor device or devices in one of the two branches. The other branch can be used to pass the full power pad voltage to the internal nodes when the EEPROM is in algorithm. That can be accomplished through the use of switching logic that selectively activates the transistor device in the second branch. Because the internal node voltage is set at a value substantially above zero, the transistor device in the second branch is not subjected to sustained voltage gradients on the order of 12 volts, which in turn permits the use of smaller thin oxide devices.

Figure 1:
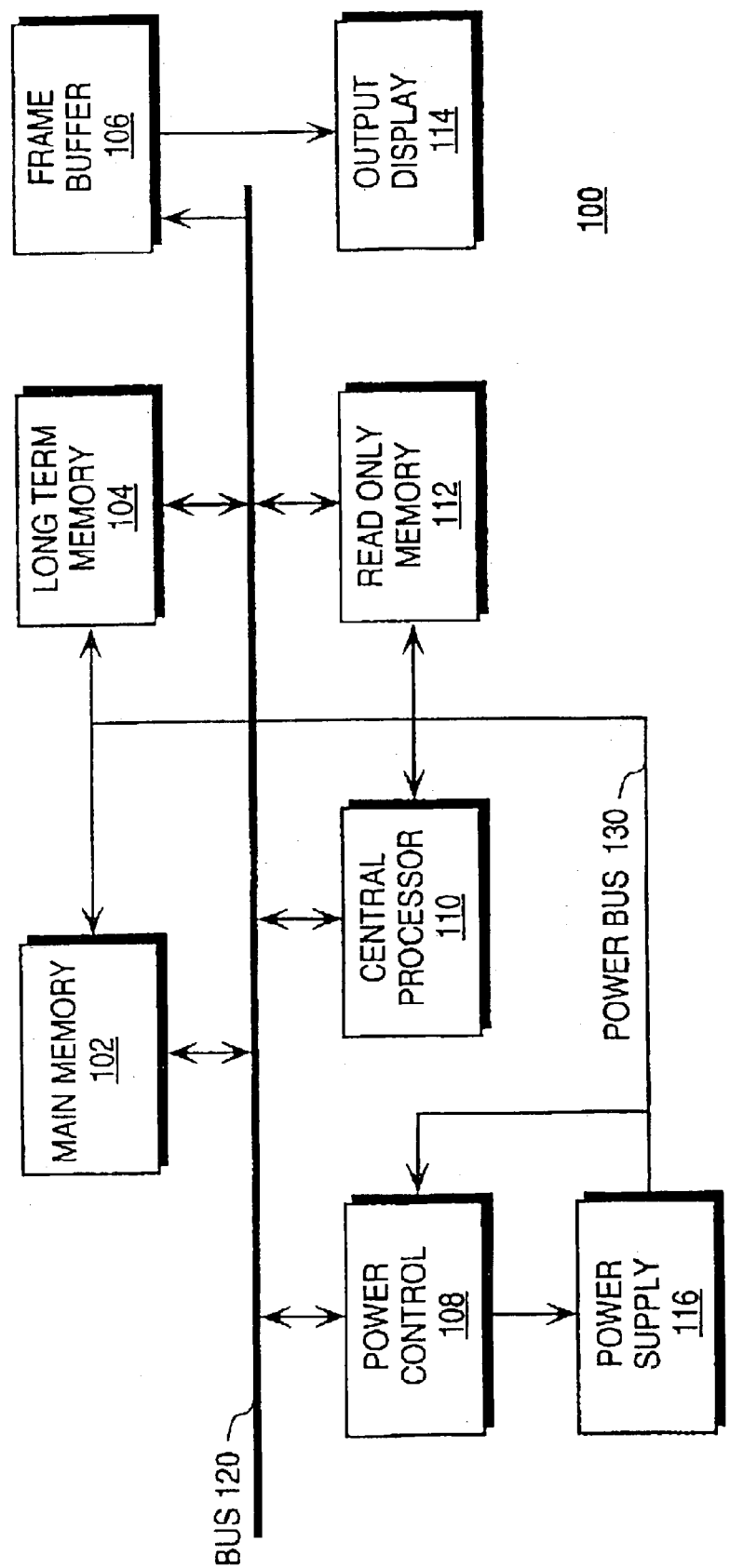
FIG. 1 is a block diagram illustrating a computer system that can utilize the present invention.

FIG. 1 shows a computer system 100 into which the present invention can be incorporated. The system 100 includes a central processor 110 which carries out the various instructions provided to the computer 100 for its operations. The central processor 110 is joined to a bus 120 adapted to carry information to various components of the system 100. Joined to the bus 120 is main memory 102 which is typically constructed of dynamic random access memory arranged in a manner well known to those skilled in the prior art to store information during a period in which power is provided to the system 100. Also joined to the bus 120 is read only memory 112 which may include various memory devices well known to those skilled in the art each of which is adapted to retain a particular memory condition in the absence of power to the system 100. The read-only memory 112 typically stores various basic functions used by the processor 110 such as basic input/output processes and startup processes typically referred to as BIOS processes. Such read-only memory 112 may be constructed of flash EEPROM memory cells adapted to be modified as various ones of the BIOS processes used by a particular computer are changed. If the read-only memory 112 is constructed of flash EEPROM memory cells, it may be modified by running an update process on the computer itself to reprogram the values stored in the read-only memory 112. Typically, such flash EEPROM memory will include circuitry for programming and erasing the memory array.

Also connected to the bus 120 are various peripheral components such as long term memory 104 and circuitry such as a frame buffer 106 to which data may be written which is to be transferred to an output device such as a monitor 114 for display. The construction and operation of long term memory 104 (typically electromechanical hard disk drives) is well known to those skilled in the art. However, rather than the typical electro-mechanical hard disk drive, a flash EEPROM memory array may be used as the long term memory 104. Such flash EEPROM memory arrays are programmed and erased through techniques which utilize voltages greater than those typically available to the integrated circuits of more advanced portable computers. Such flash EEPROM memory arrays typically include circuitry for programming and erasing the memory array. Consequently, in accordance with the present invention, such long term memory arrays as well as memory 112 may provide circuitry for generating high voltages from the lower voltages available from the batteries typically utilized with such computers. In order to generate accurate high voltages for programming and erasing such flash EEPROM memory arrays the present invention introduces voltage regulation circuitry needed to generate precise programming voltages.

Circuitry is also shown in FIG. 1 by which power may be supplied through a power bus 130 to various components of the system 100. This includes in the exemplary embodiment a power control circuit 108 which controls the various states for applying power to the system 100 and a battery 116 which may be utilized in a portable computer for furnishing power to the system 100 under control of the power control circuitry 108. In any particular arrangement, the power control circuitry 108 may actually be a part of a particular portion of the circuit of FIG. 1. For example, if the read only memory were to be constructed of flash EEPROM memory devices, power control circuitry 108 including voltage reference circuitry in accordance with the present invention might be a physical portion of the read only memory block.

Figure 2:
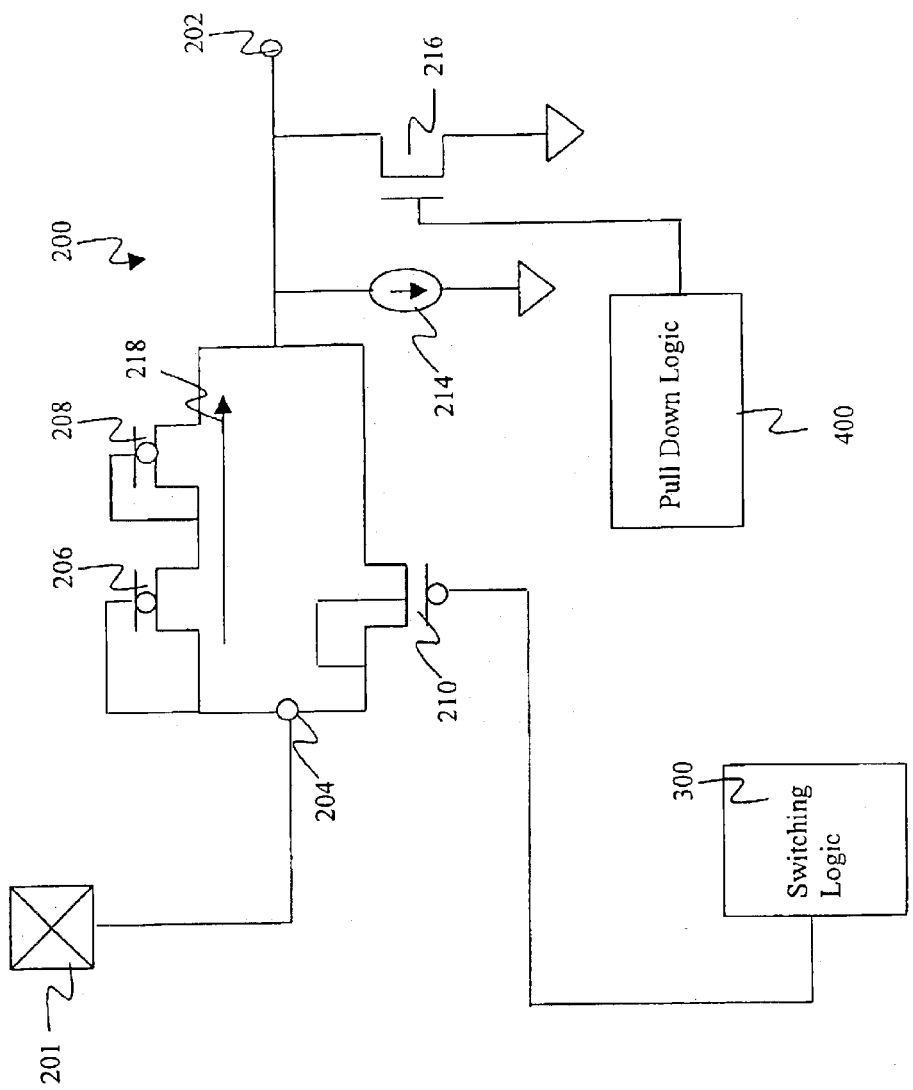
FIG. 2 is a circuit and block diagram illustrating one embodiment of a protection circuit.

FIG. 2 illustrates a circuit diagram for one embodiment of a protection circuit 200 particularly suited for use in connection with the flash EEPROM devices discussed above. Power supply pad 201 supplies Vpp to the protection circuit 200. Vpp can be supplied by charge pump circuits such as those described in U.S. Pat. No. 5,553,030, entitled "Method and Apparatus for Controlling the Output Voltage Provided by a Charge Pump," issued to Kerry D. Tedrow et al. on Sep. 3, 1996, and assigned to the assignee of the present invention, or other known means. Vpp can be 12 volts or another voltage sufficient to effectuate programming and erase operations in a flash EEPROM connected to node 202. Power supply pad 201 maintains node 204 at Vpp.

Transitor devices 206 and 208 are special N-type devices referred to as S devices. S devices are basically N-type devices having a very low threshold voltage level. The use and manufacture of S devices are described in detail in U.S. Pat. No. 5,057,715, entitled "CMOS Output Circuit Using A Low Threshold Device," issued to Larsen et al. on Oct. 15, 1991, and assigned to the assignee of the present invention. Device 206 is connected in diode fashion to node 204. The gate and drain of device 206 are connected to node 204. The source of device 206 is connected to a second diode-configured transistor device 208. The gate and drain of device 208 are connected to the source of device 206. The source of transistor device 208 is connected to node 202. In the depicted embodiment, both S devices have a threshold voltage of about 0.8 volts with transistor body effect.

P device 210 is a p-channel transistor device, which has an oxide layer significantly thinner than the M and O devices described above. The source of device 210 is connected through node 204 to the power supply pad 201 and the source of n-channel device 206. The drain of transistor device 210 is connected to node 202 and the source of device 208. The gate of device 210 is connected to switching logic 300, which is described in more detail hereinbelow.

Also connected to node 202 is a constant current source 214 and a N-type transistor device 216. In a preferred embodiment, current source 214 maintains the branch current at 2–5 microamperes. The drain of transistor device 216 is connected to node 202. The gate of device 216 is connected to pull-down logic 400, which is also described in more detail hereinbelow.

In operation, the circuit of FIG. 2 protects devices connected to node 202 from Vpp and passes Vpp when the associated flash EEPROM device is in an erase or program algorithm. A small sub-threshold current 218 flows through the diode-connected S devices 206 and 208. The threshold voltage drops across devices 206 and 208 set the voltage of node 202 at Vpp–2Vts, where Vts refers to the threshold voltage of the S devices. Constant current source 214 bleeds the sub-threshold current off node 202, thereby maintaining the node voltage at approximately Vpp–2Vts. Accordingly, the drain-gate voltages of P device 210 is only 2Vts, which is well below the maximum tolerable steady state voltage stress.

Switching logic 300 maintains the gate voltage at Vpp when the chip is not in algorithm. During program or erase modes, logic 300 grounds the gate of P device 210, which permits Vpp to pass to the internal nodes of the flash chip. After the algorithm is complete, logic 300 brings the gate of device 210 back to Vpp, which turns device 210 off and prevents Vpp from passing to node 202. Pull down logic 400 then pulses the gate of device 216 with a 20–30 nanosecond Vcc pulse to activate device 216. When device 216 is active, approximately 2Vts is dropped between the device's drain and source. The voltage of node 202 is thus dropped immediately back to Vpp–2Vts. At the terminating edge of the pull down logic pulse, device 216 goes inactive and the circuit 200 resumes steady state, or non-algorithm, operation.

Figure 3:
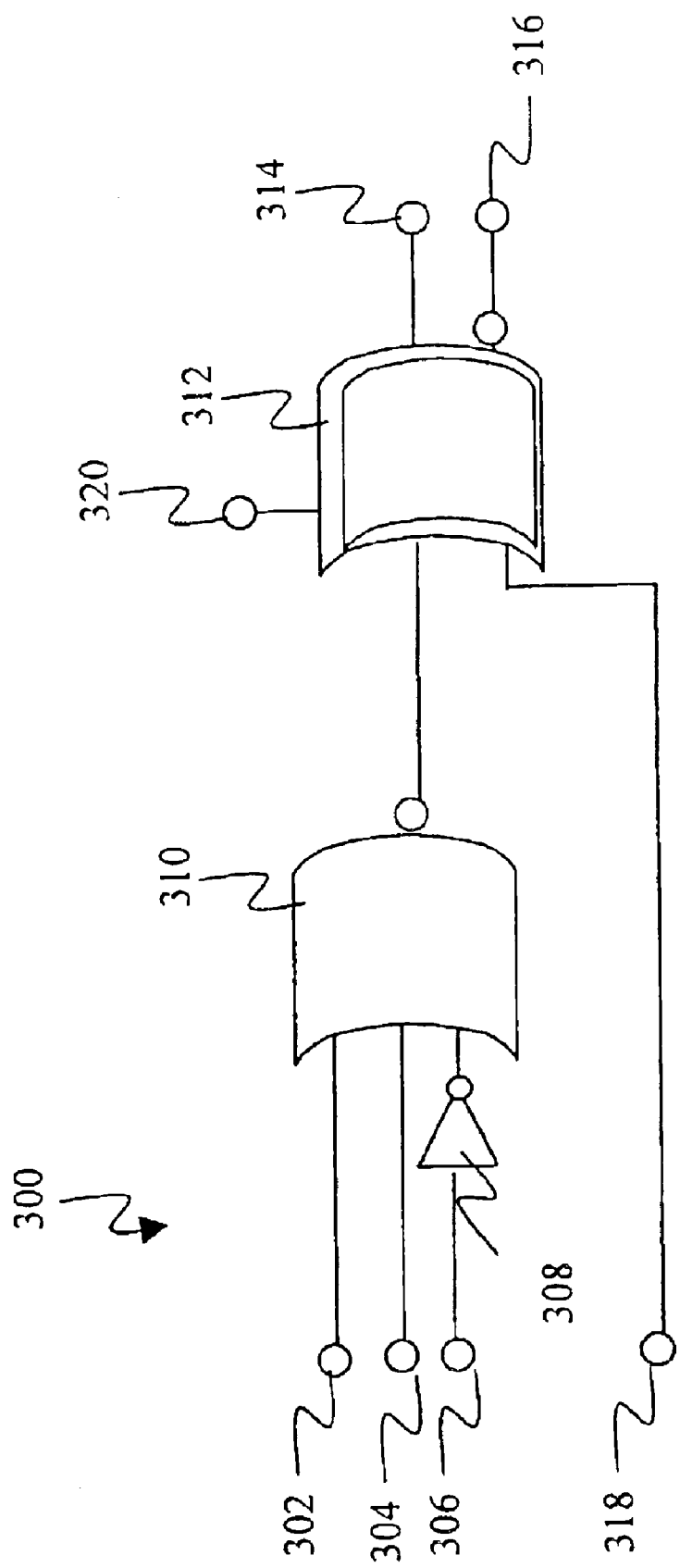
FIG. 3 is a logic diagram illustrating one embodiment of the switching logic identified in FIG. 2.

FIG. 3 is a logic diagram depicting a circuit that can be used as switching logic 300. Inputs 302, 304 are control or test bits. Input 306 from a micro-controller (not shown) is coupled to an inverter 308. Input 306 is 0 when the EEPROM is in algorithm. Inputs 302, 304 and inverter 308 are coupled to NOR gate 310. Accordingly, whenever one of the test bits is 1 or the EEPROM is in algorithm, the output from the NOR gate is 0. The NOR gate output is one input for level shifter 312. The other is a low voltage trigger 318 which is 1 when an unacceptably low Vcc is observed, and 0 otherwise. The remaining input 320 to level shifter 312 is tied to the power pad 201. Whenever the input from the NOR gate or low voltage trigger is 1, the output 314 of the level shifter 312 is Vpp and the bar output 316 is 0. When both are low, output 314 is 0 and the bar output is Vpp. The bar output 316 is conductively coupled to the gate of device 210. Accordingly, switching logic 300 takes the gate of transistor device 210 low when the EEPROM is in a program or erase mode, thereby passing Vpp to the internal nodes of the EEPROM device.

Figure 4:
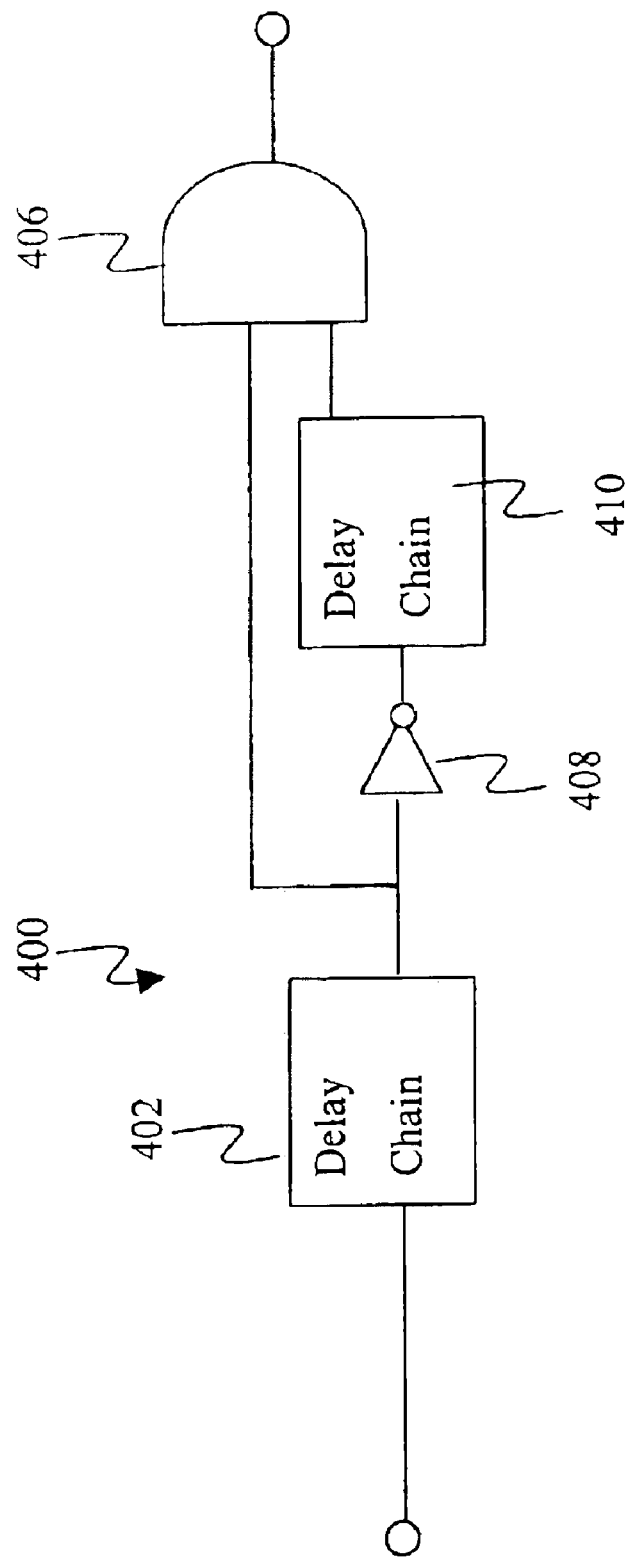
FIG. 4 is a logic diagram illustrating one embodiment of the pull-down logic identified in FIG. 2.

Turning now to FIG. 4, depicted is an exemplary embodiment of pull-down logic 400. Delay chain 402 accepts as input the inverted output of NOR gate 310. Delay chain 402 is preferably configured so as to provide about a 100 nanosecond delay. The output of the delay chain 402 is thus 0 under steady state conditions and 1 when the EEPROM is in algorithm. That output is tied to AND gate 406 and inverter 408, which is in turn tied to delay chain 410. The output of delay chain 410, which is 1 under steady state conditions and 0 when the computer is in algorithm, is also coupled to AND gate 406. Accordingly, when the EEPROM enters algorithm, the first input of the AND gate goes high after the delay period set by delay chain 402. After a delay set by chain 410, preferably about 50 to 100 nanoseconds, the second input to the AND gate is taken low. The net effect is that a digital Vcc pulse is output to the gate of n-device 216, which in turn pulls down the voltage of node 202 after completion of the algorithm.

Referring again to FIG. 2, the constant current source 214 may be provided by coupling known current generators to the gates of one or more n-type transistor devices whose drains are connected to node 202. Suitable logic can be used to provide Vcc to the gates of transistor devices in the current generator, thereby transmitting current, preferably on the order of 10 mircoamperes, to the gates of the transistor devices connected to node 202.

In other embodiments, the protection circuit of the instant invention may be used in different systems to protect low-voltage tolerant devices from high voltage sources. For instance, the circuit 200 can be used to protect circuits on parts of the chip other than the pad. The protection circuit 200 may also be readily modified to work with variable voltage sources or power supply pads. S devices 206 and 208 may be substituted with other transistor devices having acceptable threshold voltages, and can be advantageously replaced with other thin oxide layer devices. The leaker current source 214 may be substituted with variable controlled voltage sources, transistor devices having sub-threshold current, or an RC circuit that maintains node 202 at a reduced voltage during steady state operation. P device 210 can be advantageously replaced with other thin oxide devices which pass an acceptably high percentage of the source or power pad voltage. P device 210 can be replaced with thick oxide M and O devices or a combination of transistor devices. Logic 300 can be substituted with any suitable switching circuit that activates or disables transistor devices in protection circuit 200 to permit the passage of a substantial fraction of the supply voltage. For example, level shifter 312 can be replaced with a resistor divider circuit coupled to N devices, wherein the resistor and N devices are configured such that the output of switching logic 300 is identical but no transistor device experiences stress from a Vpp input. The pull-down circuit 216, 400 can be advantageously replaced with any suitable array of transistor devices that serve to maintain the node voltage 202 at a desired level after completion of an algorithm. Those skilled in the art will appreciate that leaker 214 and pull-down device 216 can in certain circumstances be combined into one transistor device having an appropriate sub-threshold current. The leaker and/or pull-down elements may be eliminated entirely if the other devices are selected so that the appropriate node voltage is maintained at the drain of device 210.

Aspects of the invention provide for one or more of the following advantages. The use of high GM, thin oxide devices greatly reduces the size of the transistor devices, and accordingly reduces the overall cost and size of the chip. The protection circuit can provide for the maintenance of a relatively constant flash chip node voltage when not in algorithm. The circuit can also provide rapid transition from Vpp to steady state node voltage after an algorithm is complete. The circuit also optionally permits the passage of Vpp through a single transistor device with the use of a single switch. Moreover, the protection circuit is much less complex and involves fewer components than previous protection devices, which further reduces material and production costs.

As used herein, the term "thin oxide transistor" refers to a device having an oxide layer substantially thinner than 320 Angstroms. Thick oxide devices typically have a gate oxide that is 320 to 340 Angstroms thick. The thin oxide P devices used in the depicted embodiments preferably have a gate oxide thickness of less than about 250 Angstroms, and most preferably in range of 170 to 190 Angstroms.

The terms "coupled" or "joined," are used with reference to components that are directly or indirectly joined together. If one or more intermediary components are inserted between two referenced components, the referenced components are still "coupled" or "joined," as those terms are used herein.

The term "parallel connection," as used herein, refers to a topology in which current flow is divided among two or more channels from a common starting point or header. Accordingly, circuit elements are considered to be in parallel even if the outputs of the elements are not directly coupled together.

A number of embodiments of the invention have been described. Nevertheless, it will be understood that various modifications may be made without departing from the spirit and scope of the invention. Accordingly, other embodiments are within the scope of the following claims.

What is claimed is:

1. A circuit comprising:
    first and second field effect transistor devices arranged to provide parallel current paths between a supply voltage and an output node, the first and second transistor devices having oxide layers with a thickness of about 200 Angstroms or less; and
    a component coupled to the output node that is intolerant of the supply voltage.

2. The circuit of claim 1 wherein the oxide layers have a thickness between about 100 Angstroms and about 190 Angstroms.

3. The circuit of claim 1 further comprising a current source coupled to the output node.

4. The circuit of claim 1 further comprising a third transistor device coupled to the output node and a circuit that activates the third transistor device when the first transistor device is deactivated.

5. The circuit of claim 1 further comprising switching logic to selectively activate the first transistor device.

6. The circuit of claim 1, wherein the transistor devices are selected from the group consisting of P devices and S devices.

7. The circuit of claim 6, wherein the first transistor device is a P device and the second transistor device is an S device.

8. The circuit of claim 7, wherein the S device is diode-connected to the voltage source.

9. The circuit of claim 1, wherein a third transistor device is disposed between the first transistor device and the output node and wherein the third transistor device has an oxide layer with a thickness greater than about 200 Angstroms.

10. The circuit of claim 1, wherein the supply voltage is selected from the group consisting of about 3 volts, about 5 volts and about 12 volts.

11. A computer system, comprising:
a central processor;
a system bus coupled to the processor;
a main memory coupled to said system bus; and
a programmable non-volatile long term memory coupled to said system bus, further comprising:
a flash EEPROM memory array; and
a circuit for providing a voltage substantially higher than Vcc to the EEPROM array, said
circuit comprising:
first and second field effect transistor devices arranged to provide parallel current paths between a supply voltage and an output node, the first and second transistor devices having oxide layers with a thickness of about 200 Angstroms or less; and
a component coupled to the output node that is intolerant of the supply voltage.

12. The system of claim 11 wherein the oxide layers have a thickness of about 100 to about 190 Angstroms.

13. The system of claim 11 further comprising a current source coupled to the output node.

14. The system of claim 11 further comprising a third transistor device coupled to the output node and pull down switching logic that activates the transistor when the first transistor device is deactivated.

15. The system of claim 11 further comprising switching logic to selectively activate the first transistor device.

16. The system of claim 11, wherein the transistor devices are selected from the group consisting of P devices and S devices.

17. The system of claim 16, wherein the first transistor device is a P device and the second transistor device is an S device.

18. The system of claim 17, wherein the S device is diode-connected to the voltage source.

19. The system of claim 11, wherein a third transistor device is disposed between the first transistor device and the output node and wherein the third transistor device has an oxide layer with a thickness greater than about 200 Angstroms.

20. The system of claim 11, wherein the supply voltage is selected from the group consisting of about 3 volts, about 5 volts and about 12 volts.

21. A method comprising:
providing first and second field effect transistor devices arranged to provide parallel current paths between a supply voltage and an output node, the first and second transistor devices having oxide layers with a thickness of about 200 Angstroms or less, wherein the output node is coupled to a component that is intolerant of the supply voltage; and
selectively activating the first transistor device to pass substantially the entire supply to the output node.

22. The method of claim 21, further comprising bleeding sub-threshold current from the output node.

23. The method of claim 22, wherein the bleeding is performed by a current source coupled to the output node.

24. The method of claim 21, further comprising pulling down the output node voltage to the steady state output node voltage upon deactivation of the first transistor device.

25. The method of claim 24 wherein the pull down is effected by a third transistor device coupled to the output node and logic that activates the transistor when the first transistor device is deactivated.

26. The method of claim 21 wherein the oxide layers have a thickness of about 100 to about 190 Angstroms.

27. The method of claim 21 wherein the first transistor device is activated by a logic network.

28. The method of claim 21, wherein the transistor devices are selected from the group consisting of P devices and S devices.

29. The method of claim 28, wherein the first transistor device is a P device and the second transistor device is an S device.

30. The method of claim 29, wherein the S device is diode-connected to the voltage source.

31. The method of claim 21, wherein the supply voltage is selected from the group consisting of about 3 volts, about 5 volts and about 12 volts.

32. A method of selectively conditioning a supply voltage within an integrated circuit comprising:
providing first and second transistor devices arranged to provide parallel current paths between the supply voltage and an output node within the integrated circuit, wherein the first and second transistor devices have oxide layers with a thickness of about 200 Angstroms or less, and wherein the second transistor device provides a sustained voltage at the output node that is substantially reduced below the supply voltage; and
selectively activating the first transistor device to pass substantially the entire supply to the output node.

33. The method of claim 32, further comprising bleeding sub-threshold current from the output node.

34. The method of claim 33, wherein the bleeding is performed by a current source coupled to the output node.

35. The method of claim 32, further comprising pulling down the output node voltage to the steady state output node voltage upon deactivation of the first transistor device.

36. The method of claim 32 wherein the oxide layers have a thickness of about 100 to about 190 Angstroms.

37. The method of claim 32, wherein the transistor devices are selected from the group consisting of P devices and S devices.

38. The method of claim 37, wherein the second transistor device is an S device and is diode-connected to the supply voltage.

39. The method of claim 32, wherein the supply voltage is selected from the group consisting of about 3 volts, about 5 volts and about 12 volts.

40. A method comprising:
supplying a supply voltage to an input node;
selectively activating a first transistor device coupled to the input node to pass substantially the entire supply voltage to an output node; and
bleeding sub-threshold current through a second transistor device in parallel with the first transistor device to provide a voltage at the output node that is substantially reduced below the supply voltage, wherein the first and second transistor devices have oxide layers with a thickness of about 200 Angstroms or less.

41. The method of claim 40 wherein the oxide layers of the first and second transistor devices have a thickness of about 100 to about 190 Angstroms.

42. The method of claim 40, wherein the bleeding is performed by a current source coupled to the output node.

43. The method of claim 40, further comprising pulling down the output node voltage to the steady state output node voltage upon deactivation of the first transistor device.

44. The method of claim 40, wherein the transistor devices are selected from the group consisting of P devices and S devices.

45. The method of claim 44, wherein the second transistor device is an S device and is diode-connected to the input node.

46. The method of claim 40, wherein the supply voltage is selected from the group consisting of about 3 volts, about 5 volts and about 12 volts.

47. The method of claim 40, further comprising controlling a logic network to activate the first transistor device.

48. A method of reducing a voltage at an output node of a power supply comprising:

supplying a supply voltage to an input node of the power supply;

selectively activating a first transistor device coupled to the input node to pass substantially the entire supply voltage to the output node; and bleeding sub-threshold current through a second transistor device in parallel with the first transistor device to reduce the voltage across the first device to a voltage that is substantially less than the voltage at the input node, wherein the first and second transistor devices have oxide layers with a thickness of about 200 Angstroms or less.

49. The method of claim 48 wherein the oxide layers of the first and second transistor devices have a thickness of about 100 to about 190 Angstroms.

50. The method of claim 48, wherein the bleeding is performed by a current source coupled to the output node.

51. The method of claim 48, further comprising pulling down the output node voltage to the steady state output node voltage upon deactivation of the first transistor device.

52. The method of claim 48, wherein the transistor devices are selected from the group consisting of P devices and S devices.

53. The method of claim 52, wherein the second transistor device is an S device and is diode-connected to the input node.

54. The method of claim 48, wherein the supply voltage is selected from the group consisting of about 3 volts, about 5 volts and about 12 volts.

55. The method of claim 48, further comprising controlling a logic network to activate the first transistor device.

\* \* \* \* \*